United States Patent [19]

Owens et al.

[11] Patent Number: 4,598,460
[45] Date of Patent: Jul. 8, 1986

[54] METHOD OF MAKING A CMOS EPROM WITH INDEPENDENTLY SELECTABLE THRESHOLDS

[75] Inventors: Alexander H. Owens, Pennington, N.J.; Mark A. Halfacre, Horsham; David S. Pan, Doylestown, both of Pa.

[73] Assignee: Solid State Scientific, Inc., Willow Grove, Pa.

[21] Appl. No.: 680,197

[22] Filed: Dec. 10, 1984

[51] Int. Cl.[4] ............... H01L 21/265; G11C 11/40; B01J 17/00
[52] U.S. Cl. .................. 29/571; 29/576 B; 29/577 C; 29/578; 148/1.5; 148/187; 357/42; 357/91
[58] Field of Search ............ 29/571, 576 B, 577 C, 29/578; 148/1.5, 187; 357/42, 91

[56] References Cited

U.S. PATENT DOCUMENTS

| | | | |
|---|---|---|---|
| 4,142,926 | 3/1979 | Morgan | 148/187 |
| 4,151,021 | 4/1979 | McElroy | 148/187 |
| 4,288,256 | 9/1981 | Ning et al. | 148/1.5 |
| 4,315,781 | 2/1982 | Henderson | 148/1.5 |
| 4,329,186 | 5/1982 | Kotecha et al. | 148/1.5 |
| 4,355,455 | 10/1982 | Boettcher | 29/571 |
| 4,373,248 | 2/1983 | McElroy | 29/571 |
| 4,373,249 | 2/1983 | Kosa et al. | 29/571 |
| 4,377,818 | 3/1983 | Kuo et al. | 357/23 |
| 4,385,947 | 5/1983 | Halfacre et al. | 148/187 |
| 4,468,852 | 4/1984 | Cerofouni | 29/571 |
| 4,471,523 | 9/1984 | Hu | 29/571 |
| 4,472,871 | 9/1984 | Green et al. | 29/571 |
| 4,495,693 | 1/1985 | Iwahashi et al. | 29/571 |
| 4,513,494 | 4/1985 | Batra | 29/576 B |
| 4,525,920 | 7/1985 | Jacobs et al. | 29/571 |

OTHER PUBLICATIONS

ISSCC, Thursday, Feb. 23, 1984 "256Kb CMOS EPROM" by William Ip et al. pp. 138 and 139.
ISSCC, Thursday, Feb. 23, 1984 "A Programmable 256K CMOS EPROM with On-Chip Circuits" by S. Tanaka et al, pp. 148 and 149.

Primary Examiner—Upendra Roy

[57] ABSTRACT

A process for making an integrated cirucit EPROM having an array of EPROM devices and CMOS peripheral circuits, including blanket depositions of a first and a second polysilicon layers on a silicon substrate and removing portions of those polysilicon layers. The EPROM floating gate is made from the first polysilicon layer, and the EPROM control gate as well as the P-channel and N-channel gates of the peripheral transistors are all made from the second polysilicon layer. Independently adjustable thresholds for each of the three device types are made possible by forming an N-well at the substrate region at which the P-channel device is to be built, blanket implanting all three channels prior to selectively forming the first polysilicon layer over the EPROM region, and then selectively doping the channels of the N- and P-channel devices only.

10 Claims, 15 Drawing Figures

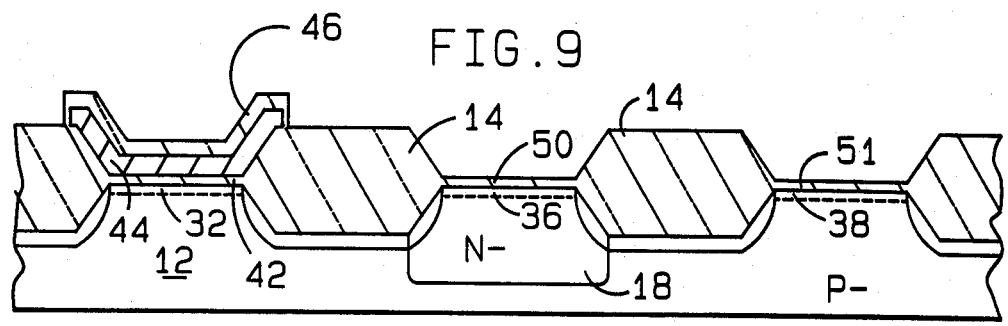
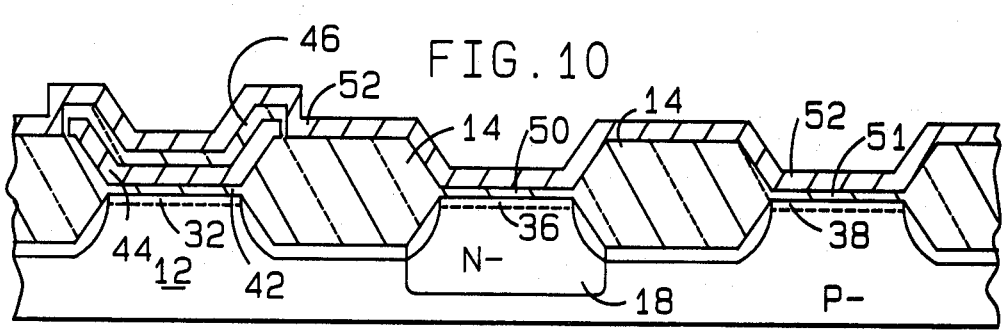
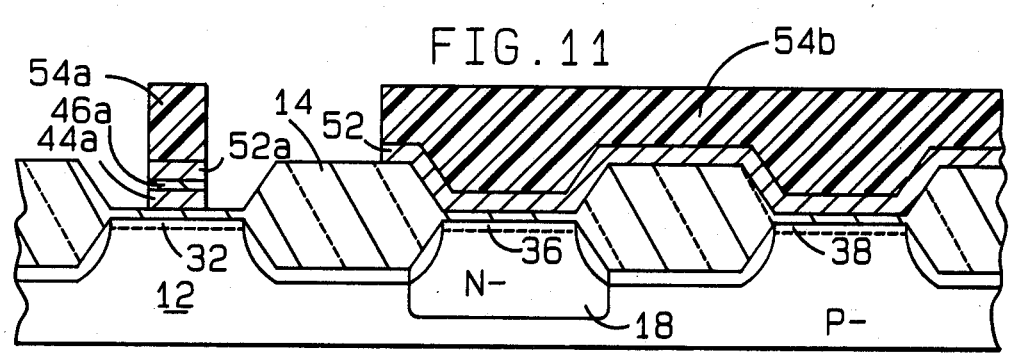
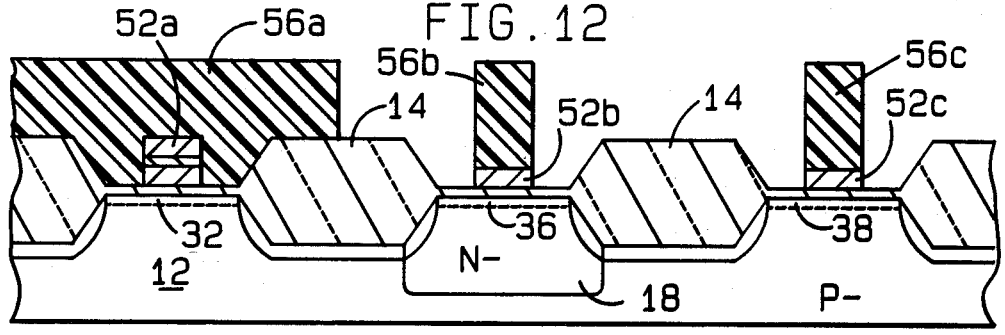

METHOD OF MAKING A CMOS EPROM WITH INDEPENDENTLY SELECTABLE THRESHOLDS

BACKGROUND OF THE INVENTION

This invention relates to EPROM semiconductor devices, and in particular to EPROM devices having both N-channel and P-channel peripheral devices.

EPROM semiconductor circuits are well known in the art. EPROM circuits include a matrix of EPROM devices, each of which stores a bit of information, and a plurality of peripheral transistor devices. Peripheral transistors are required for such functions as row decode and column decode of the EPROM matrix, latches and drivers.

Each device, whether EPROM or peripheral, has a threshold. This threshold is the voltage level which, when applied to a FET control gate, turns the device on, allowing current to pass through its channel between its source and drain. That voltage level is determined by the sum of all the dopants in the channel region between the source and the drain and the thickness of an oxide layer between the channel and the control gate. And additionally, in the case of an EPROM device, the threshold level is determined by the charge stored on the floating gate.

In addition to having a control gate similar to the control gate of the peripheral devices, EPROM devices have a floating gate positioned below the control gate. It is this floating gate which allows the EPROM device to store charge, thereby programming the EPROM device. Conversely, when the EPROM device is unprogrammed, the floating gate is uncharged.

The architecture thus required places constraints on the size of the EPROM cell. Since the floating gate must rest directly below the control gate, both gates must be large enough to allow their proper alignment. Self-alignment of both the control gate and the floating gate allows a reduction in the size of the EPROM device.

Conventional commercial EPROM integrated circuits are NMOS wherein both the EPROM and all the peripherals are N-channel devices. The inability in practice to use P-channel transistors where their use would be beneficial has resulted in the need for a greater number of transistors (all N-channel) to perform a desired function using only N-channel transistors as well as a much larger power consumption. Peripheral circuitry could thus be reduced in size if both N-channel and P-channel transistors were used in the peripherals. Heretofore, no method has been known for integrating EPROM devices with both N-channel and P-channel transistors, that allows independently controlled threshold voltages for the three device types and/or is capable of producing self-aligned gates in the EPROM devices.

P-channel devices in a CMOS VLSI design vastly reduce the power consumption of the circuit as compared to the same circuit designed with only N-channel devices. Although it is known to combine in one chip EPROM devices, and peripheral N-MOS and P-MOS devices, the results tend to be unsatisfactory because conventional fabrication processes place serious constraints on the thresholds of those three basic FET devices.

Thus, for example, if a given threshold were required for the EPROM devices, the choices for the thresholds for one or both of the peripheral devices were constrained.

It is, therefore, an object of this invention to provide a CMOS EPROM semiconductor circuit wherein both the floating gate and the control gate of the EPROM are self-aligned.

It is a further object of this invention to provide a CMOS EPROM semiconductor circuit wherein the thresholds of the EPROM, the N-channel transistors, and the P-channel transistors may all be selected independently of each other.

SUMMARY OF THE INVENTION

A method is provided for fabricating a self-aligned N-channel EPROM and an N-channel transistor in a P-conductivity type substrate, wherein an N-well is formed for a P-channel transistor. A first polysilicon layer having an oxide layer thereupon is formed over the EPROM device region. A second polysilicon layer is formed over the entire substrate. A masking layer is formed over a portion of the EPROM device region and the first and second polysilicon layers and the oxide layer are removed from the portion of the EPROM device region not covered by the mask to form, respectively, the EPROM floating gate and the EPROM control gate. The gates of the P-channel and N-channel transistor devices are formed from portions of the second polysilicon layer and the sources and drains of all devices are formed.

A second important feature in the method of this invention is the doping of channels of the three device types such that each of the three channels contains a dopant that is independently determinable, and thus the respective threshold voltages are independently determinable.

This is accomplished by:

(a) selectively introducing N-type impurities in the region of the P-channel transistor while the channels of the N-type transistor and the EPROM device are masked off;

(b) introducing P-type impurities into the channel regions of all transistors including the EPROM device; and (c) selectively introducing P-type impurities in the channel region of the P-channel and the N-channel transistors, while the channel of the EPROM device is covered by a mask.

The latter steps are particularly compatible with the above-mentioned steps for forming only the EPROM floating gate from the first polysilicon layer while at the same time employing a minimum number of masking steps. For example, the EPROM floating gate is formed before and covers the EPROM channel during the simultaneous doping of the channels of the CMOS transistors in step (c) above.

BRIEF DESCRIPTION OF THE DRAWINGS

FIGS. 1 to 15 illustrate the process of fabricating the self-aligned CMOS EPROM of the present invention.

DESCRIPTION OF THE PREFERRED EMBODIMENTS

Figure 1:
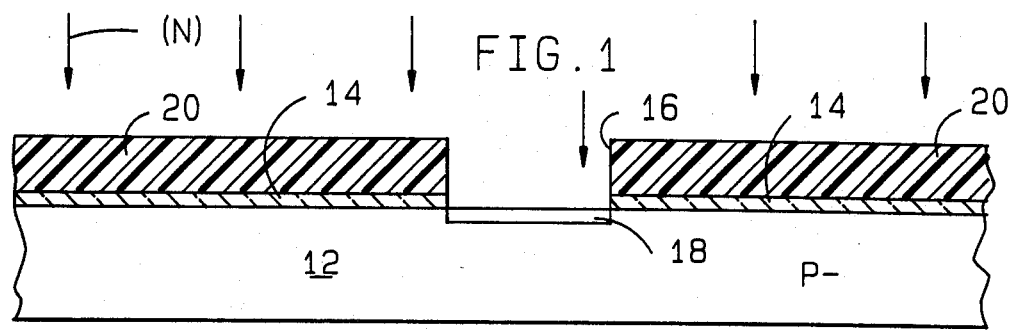

Referring now to FIG. 1, there is shown a P-type substrate 12 upon which a self-aligned EPROM and both P-channel and N-channel peripheral transistors with independent thresholds are to be formed. Substrate 12 is covered with a silicon dioxide layer 14. Oxide layer 14 is formed by exposing substrate 12 to a high temperature in the presence of oxygen. After this initial oxidation, a conventional photoresist etch is performed. In this etching step, a layer of photoresist 20 is used to selectively etch oxide layer 14 creating an aperture 16 in oxide layer 14.

This is followed by an N-well ion implant. In this step N-type ions such as phosphorous ions bombard the entire surface shown in FIG. 1. However, only region 18 of substrate 12 beneath aperture 16 receives these N-type ions causing a predetermined concentration of impurities in region 18. Region 18 is the channel region of a P-channel transistor and the impurity concentration resulting from this implant, along with the thickness of a subsequent gate oxide layer and subsequent implants, determines the threshold of the P-channel transistor. The threshold is the voltage level which will turn the P-channel transistor on, allowing electrons to pass through region 18 between source and drain.

During this ion implant, all regions which are not to be formed into P-channel transistors are covered by layers 14 and 20. Because the P-channel threshold is determined by the sum of all the dopants in region 18 and because all other regions are masked, by control of this ion implant, the threshold of the P-channel transistor can be determined, independently of the thresholds of either the N-channel transistors or the EPROM by varying the dose of the N-well implant in this step.

Figure 2:
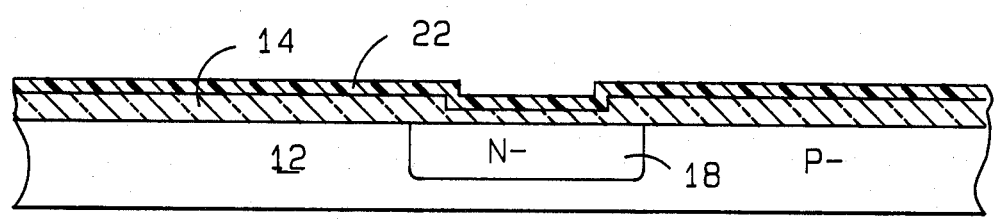

Following the N-type implant, photoresist layer 20 is stripped, and an N-well diffusion is performed. In this step the substrate is raised to a high temperature, approximately 1200°. This high temperature causes the N-type dopant to migrate forming an N-well 18 as shown in FIG. 2. Before the diffusion, well 18 had a depth of approximately a few thousand angstroms. After the diffusion, it has a depth of approximately 30,000 angstroms. This creates the N-well in which the P-channel transistor is built.

During the high temperature diffusion process, layer 14 grows several hundred angstroms because of further oxidation. An extension of oxide layer 14 above well 18 is also formed for the same reason.

Figure 3:
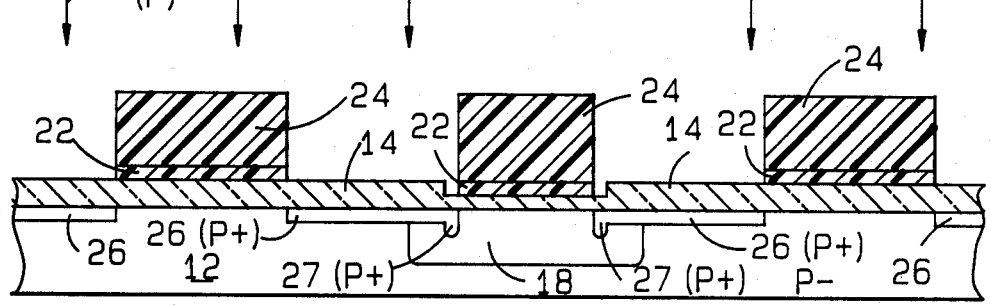

Silicon nitride is then deposed on the surface of oxide layer 14 forming nitride layer 22. After nitride layer 22 is deposed, a nitride etch is performed. For a nitride etch, a photoresist masking layer 24, shown in FIG. 3, is formed to mask all the regions where a device is to be built, whether the device is an EPROM device, a P-channel transistor, or an N-channel transistor. The formation of this masking layer 24 is referred to as a device cut photo. Using masking layer 24, a nitride etch is performed to remove the regions of silicon nitride layer 22 not covered by mask 24. This etch determines the width of each device which affects the current drive and hence the speed of the devices.

Following the nitride etch, P+ guard rings 26 are formed by a blanket boron implant. Guard ring 27 within N-well 18 is somewhat deeper than guard rings 26 because of the thin layer of oxide 14 above that portion of N-well 18.

Figure 4:
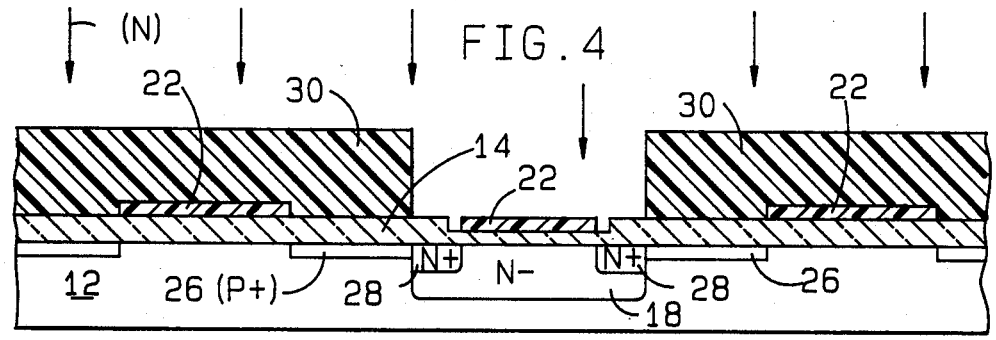

After the formation of guard rings 26 and 27, photoresist masking layer 24 is removed and a new photoresist masking layer 30 is provided. Using photoresist layer 30 and nitride layer 22 as masks, a phosphorous ion implant is performed to create N+ guard ring 28 within N-well 18 as shown in FIG. 4.

Figure 5:
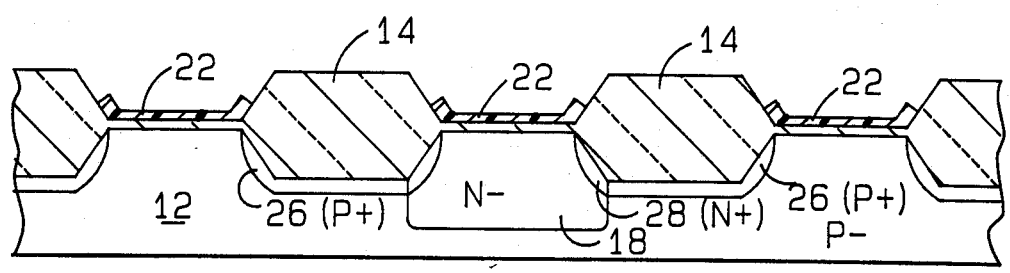

Photoresist layer 30 is then removed as shown in FIG. 5 and a field oxidation is performed. In the field oxidation process, the substrate is subjected to a high temperature for a long period of time causing oxide layer 14 to become greatly enlarged. The regions of oxide layer 14 beneath nitride layer 22 are not affected except for regions right at the edges of nitride layer 22, causing the "bird's beak" effect in which the edges of nitride layer 22 hook upwards. Thus, the various remaining portions of nitride layer 22 protect the regions where the active devices will be formed.

Figure 6:
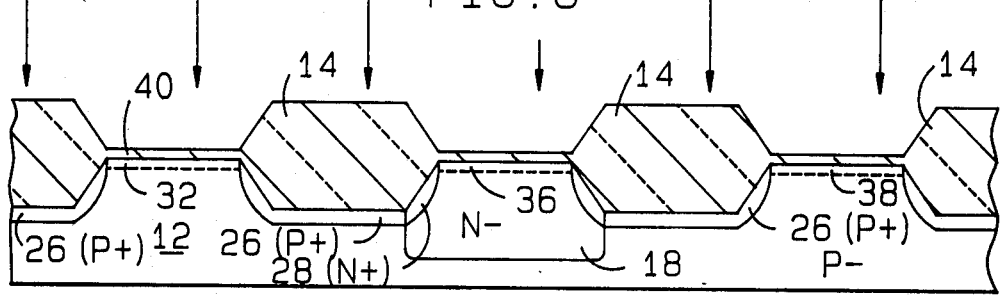

Referring now to FIG. 6, the remaining portions of nitride layer 22 are removed. Thus, nitride layer 22 is a sacrificial layer. The removal of nitride layer 22 is followed by a blanket channel implant with a P-conductivity type impurity such as boron. In this implant, the threshold of the EPROM device is adjusted independently of the threshold of the P-channel device and the N-channel device.

Channel region 32, which is the region where the EPROM channel will be formed, is doped to achieve the desired threshold in this step. The regions under the enlarged oxide layer 14 are, of course, not affected by this implant. The enlarged regions of oxide layer 14 are too thick for the implant to penetrate.

Region 36, which is the channel region of the P-channel transistor, also receives P-type implants during this step. However, as previously described with respect to FIG. 1, this region 36 was doped independently in an earlier step, at which time the doping of N-well 18 was performed. During that independent doping of region 18, the implant shown in FIG. 6 was considered and compensated for. Thus, regardless of the threshold level required for the P-channel transistor being formed at region 36, the threshold level of the EPROM device formed at region 32 may be independently determined by this ion implant.

Region 38 will be the channel of the N-channel device. N-channel 38 will, in a subsequent step, also be independently adjusted. Thus, each type of device, EPROM device, P-channel transistor and N-channel transistor, may be adjusted to a predetermined threshold independently of the thresholds of the other devices.

Silicon dioxide region 40 covers the area of substrate 12 above region 32 in which the EPROM will be formed. The thickness of the oxide at this location also determines the threshold of the EPROM. However, the thickness of region 40 was not precisely controlled. It is the result of several intermediate oxidation steps. Region 40 is therefore etched and channel region 32 exposed.

Figure 7:
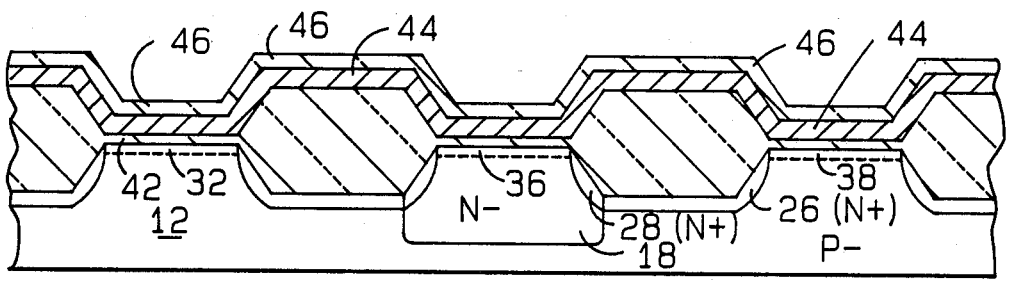

FIG. 7 shows an oxide layer 42 in the same location from which oxide layer 40 was removed. Layer 42 is grown at this location in an EPROM gate oxidation step under very precise and controlled conditions. Oxide layer 42 is one of the key elements that determine the reliability of the device. Furthermore, the independent and precisely controlled formation of oxide layer 42 provides yet another means by which the threshold of the EPROM device is established independently of the thresholds of the peripheral devices.

The EPROM gate oxidation to form layer 42 is followed by deposition of a layer of polysilicon 44. Polysilicon layer 44 is formed of conventional polycrystalline silicon which is deposited in conventional manner and then oxidized resulting in the formation of polysilicon oxide layer 46 above polysilicon layer 44. Polysilicon layer 44 may be doped with N+ type ions to make it more conductive.

Figure 8:
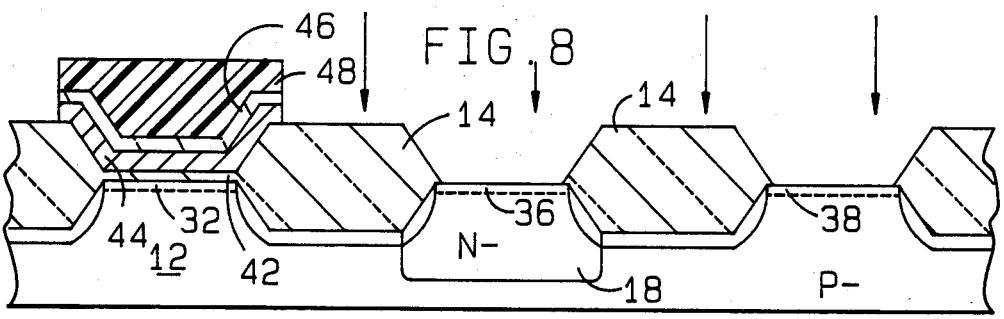

Referring now to FIG. 8, photoresist masking layer 48 is shown over the area of the EPROM only, leaving the rest of the substrate exposed. A buffered hydrofluoric acid etch is then performed to remove exposed portions of the polycrystalline silicon oxide layer 46. This is followed by a polysilicon etch to selectively remove portions of polysilicon layer 44 and a buffered hydrofluoric etch to remove silicon dioxide layer 14 above P-channel region 36 and above N-channel region 38 leaving the enlarged oxide regions 14 between devices. Thus the EPROM region has a precisely controlled oxide layer 42, a polysilicon layer 44, and a polysilicon oxide layer 46 beneath photoresist 48 while the rest of the device regions on the substrate have been cleared.

This is followed by a P-type implant step. In this implant step, the threshold of the N-channel transistor is determined independently of the threshold of the P-channel transistor and the EPROM device. To do this, the amount of P-type ions implanted in region 38 is chosen to create the required N-channel threshold taking into account, of course, the P-type implant described previously with respect to FIG. 6. Photoresist layer 48 masks the channel region of the EPROM device.

A previously described independent implantation of region 36 was chosen to compensate for both the boron implant required at this point to produce the required level of impurities in region 38 and the boron implant described with respect to FIG. 6. Additionally, as described in reference to FIG. 1, an implant of the N-well region 18 of the P-channel transistor was performed while the N-channel transistor region and the EPROM device region were covered by a masking layer 20. Thus the threshold of each of the devices may be chosen independently.

Referring now to FIG. 9, following the P-type implant which independently adjusts the threshold of the N-channel transistor by introducing the required level of impurities into region 38, photoresist 48 is stripped off and a peripheral gate oxidation is performed. This results in the precisely controlled formation of oxide region 50 above P-channel transistor region 36 and oxide region 51 above N-channel transistor region 38. It also results in a slight polysilicon oxidation thereby slightly enlarging region 46. Silicon dioxide regions 14 are also somewhat enlarged.

Referring now to FIG. 10, a second layer of polycrystalline silicon is deposited upon the substrate forming polysilicon layer 52. Polysilicon layer 52 has very high resistance. In order to make it highly electrically conductive, polycrystalline layer 52 is doped with N-type dopant, thereby creating an N+ polycrystalline layer 52.

Referring now to FIG. 11, the critical EPROM gate etches are performed. It is these etches which produce the self-aligned gate structure which allows a reduction in size of the EPROM matrix of the CMOS circuit. During these EPROM gate etches, photoresist layer 54b covers the peripheral gate regions: both P-channel transistor region 36 and N-channel transistor region 38. Photoresist 54a covers a portion of N+ polysilicon layer 52 above EPROM channel region 32.

The first etch is an N+ polysilicon etch which removes N+ polysilicon layer 52 except for the portion below photoresist layer 54a. The second etch is a buffered hydrofluoric polycrystalline oxide etch which removes polycrystalline oxide layer 46 except for the portion below photoresist layer 54a. The final etch is a polysilicon etch which removes polysilicon layer 44 except for the portion below photoresist layer 54a.

The structures below photoresist layer 54a are EPROM control gate 52a which is formed from N+ polysilicon layer 52, interpoly oxide layer 46a which is formed from polysilicon oxide layer 46, and floating gate 44a which is formed from polysilicon layer 44. By using the single photoresist layer 54a and performing the series of etches described, perfect self-alignment of both gate structures 52a and 44a is assured since both floating gate 44a, control gate 52a, and oxide layer 46a between them are forced to have the position and dimensions determined by photoresist 54a. The self-alignment of the two EPROM gate structures allows reduction in EPROM size.

Referring now to FIG. 12, following the series of etches to form the EPROM gate structures, photoresist layers 54a, b are stripped and peripheral polysilicon gate photoresist layers are formed as follows. Photoresist layer 56a entirely covers the EPROM region. Photoresist layer 56b covers a portion 52b of polysilicon layer 52 above P-channel region 36 and photoresist layer 56c covers a portion 52c of polysilicon layer 52 above N-channel region 38.

A polysilicon etch is then performed removing layer 52 except for the portion below photoresist layers 56a, b, c. The portion 52b of polysilicon layer 52 remaining below photoresist layer 56b functions as the gate of the P-channel transistor and the portion 52c of polysilicon layer 52 remaining below photoresist layer 56c functions as the gate of the N-channel transistor.

Figure 13:
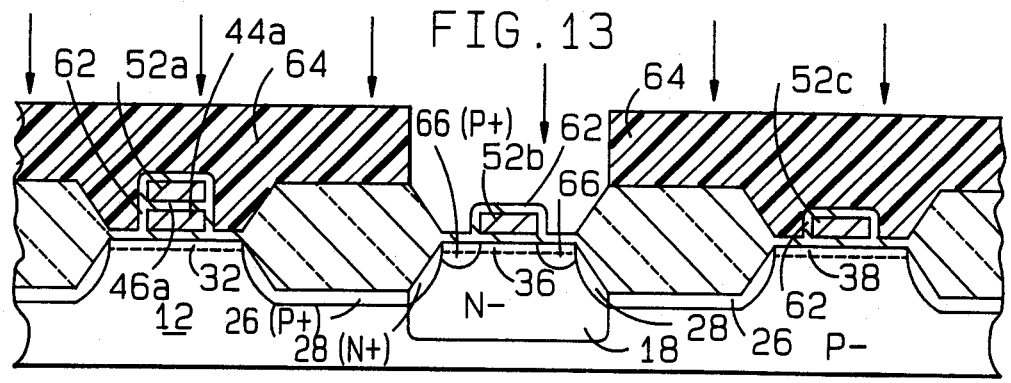

Referring now to FIG. 13, following the formation of N+ polysilicon gates 52b and 52c and the removal of photoresist layers 56a, b, and c, a polysilicon oxidation step is performed. This polysilicon oxidation step results in the formation of polysilicon oxide layers 62 on gates 52b, 52c and on the EPROM gate structure which includes floating gate 44a and control gate 52a. Next the sources and drains of the P-channel transistor and N-channel transistor are formed.

Photoresist masking layer 64 is deposited and an aperture is formed in layer 64 above N-well 18 where the P-channel transistor is to be formed. A p type ion implant is performed with masking layer 64 preventing ions from being implanted in the N-channel transistor region and in the EPROM device region. P-channel gate 52b, along with its oxide layer 62, prevent p type ions from entering channel region 36 underneath them. The enlarged regions of oxide layer 14 prevent the p type ions from being implanted in N+ guard rings 28. The result is the formation of P+ regions 66. P+ regions 66 are the source and drain regions of the P-channel transistor.

Figure 14:
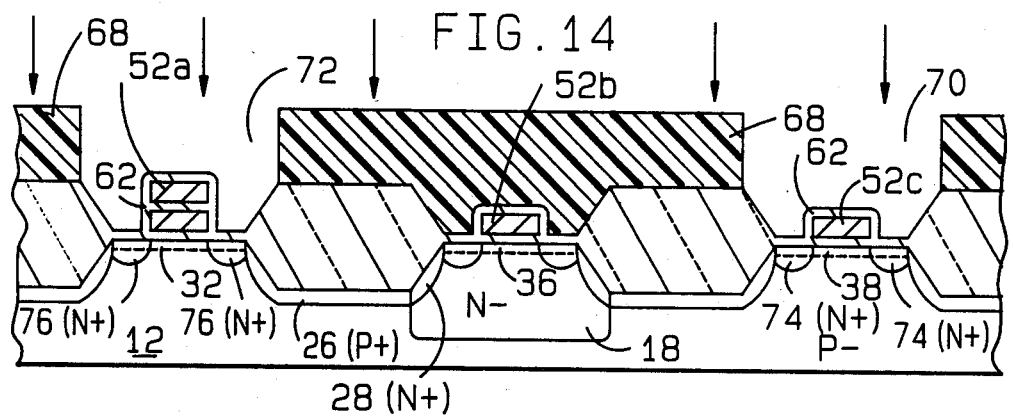

Referring now to FIG. 14, the source and drain regions of the EPROM and the N-channel transistor are formed. Photoresist layer 64 is stripped and a new photoresist layer 68 is formed. Photoresist layer 68 has aperture 70 above the region where the N-channel transistor is formed and aperture 72 above the region where the EPROM device is formed. Following the formation of apertures 70 and 72 in layer 68, N-type ions are implanted. N-channel transistor gate 52c, and its oxide layer 62 protect a portion of N-channel region 38 from receiving the ion implants. This results in the formation of N+ source and drain regions 74.

In a similar manner, control gate 52a and floating gate 44a protect a portion of N-channel region 32 and EPROM thereby causing the ion implant to form N+ source and drain regions 76. Thus, the source and drain regions 76 of the N-channel EPROM device and 74 of the N-channel transistor are formed simultaneously, and are called self-aligned N+ sources and drains.

The two procedures described above for forming the source/drain regions of the P-channel and N-channel devices, respectively, that are illustrated in FIGS. 13 and 14, respectively, may be performed in the reverse order.

It is preferred, but not essential, that after the implantation of arsenic for forming drains and sources of the N-channel transistor device and EPROM device, to implant phosphorous which is also an N-type dopant, through the same apertures 70 and 72 of the photoresist mask 68.

However, to achieve the reduced likelihood of shorting between both the sources and drains of the EPROM and N-channel devices, the secondary doping (with phosphorous) is also applied to the sources. A further advantage of phosphorous doping to both the sources and drains is that no additional photomask is required. The phosphorous implant is done using the same mask 68 as was used for the arsenic implant.

Figure 15:
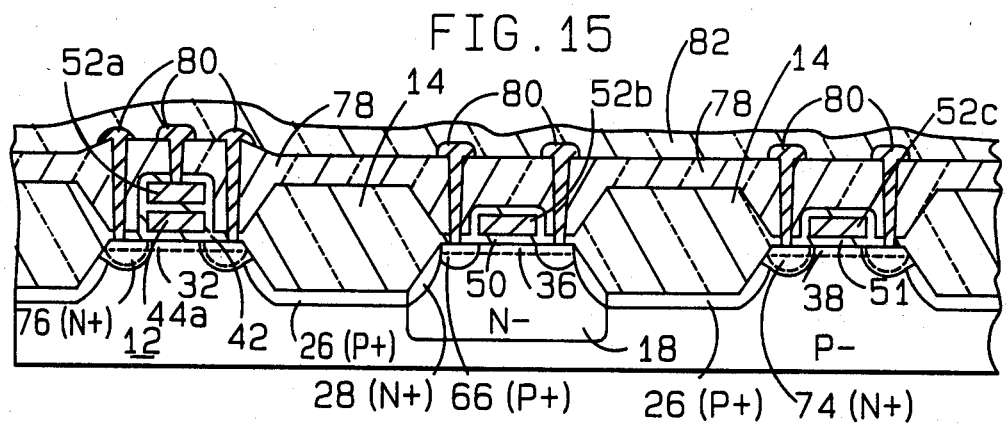

Since phosphorous has a greater diffusion rate than arsenic, the subsequent heating steps after the double doping results in the phosphorous outrunning the arsenic and spreading each of the sources and drains downward and to both the left and right as indicated in FIG. 15.

One object of this second doping is to create an EPROM drain of a high density core of arsenic ions for making good ohmic contact thereto and to form around this core a low density N-type shell of phosphorous ions that extend under the EPROM floating gate 44a to effect an improved EPROM programming efficiency. This feature is more fully explained in our application entitled Method for Double Doping Sources and Drains In An EPROM that is filed simultaneously herewith.

A second object of this second doping is to reduce the drain to body leakage and to reduce the chances of a short between the metal 80 and drain 74 and/or 76 at the silicon surface under the "birds beak" field region between the P+ stops 26 and the only-arsenic doped drains 74 and 76 as seen in FIG. 14. Such as undesirable leakage or short condition may be brought about by a slight misregistration between the metal contacts 80 and the EPROM and N-channel devices.

The improvement in programming efficiency is accomplished by the phosphorous drain extension under the floating electrode 44a which amounts to about 0.1 micron and it is therefore necessary to apply the second phosphorous doping to the drains, and not the sources, of the EPROM device.

Referring again to FIG. 15, a contact etching step is performed. In this step, glass is deposited on the surface and heated until it reflows slightly, thereby forming reflow glass layer 78. Photoresist is then deposited and contact holes are cut to all source, drain and gate regions. The photoresist is then removed.

A metal alloy is then deposited. This metal alloy comes in contact with the areas beneath the apertures which have been etched in glass layer 78, thereby forming metal contacts 80. This is followed by a metal photoresist masking and a metal etch which leaves metal above the regions to which contact is required. A passivation layer 82 is then deposited and etched, resulting in the final structure as shown in FIG. 15.

What is claimed is:

1. A method of fabricating on a P-conductivity type substrate an N-channel EPROM FET having self-aligned floating and control gates, a separate N-channel FET device, and a separate P-channel FET device in an N-conductivity type well region formed in said substrate comprising the steps of:
   (a) masking said substrate to cover the substrate regions at which said EPROM FET and N-channel device are to be formed and introducing N-type impurities into said substrate to form an N-well region at a portion thereof at which said P-channel device is to be formed;
   (b) simultaneously introducing P-type impurities into the channel regions of said EPROM FET, said P-channel and said N-channel devices;
   (c) selectively forming a first polysilicon layer over the region of the substrate at which said EPROM device is to be formed;
   (d) selectively introducing P-type impurities in said channel regions of said P-channel and N-channel devices while said EPROM region is covered by said first polysilicon layer;
   (e) forming a second polysilicon layer over the substrate region wherein said EPROM, said P-channel and said N-channel devices are to be formed;
   (f) forming on said second polysilicon layer a masking layer just over a central portion of said EPROM region and entirely over said P-channel and N-channel device regions;
   (g) removing the portions of said first and second polysilicon layers not covered by said masking layer thereby shaping the EPROM self-aligned floating and control gates;
   (h) subsequently etching away portions of said second polysilicon layer to form the gates of the P- and N-channel devices; and
   (i) introducing impurities at selected regions of said substrate to form the sources and drains of each of the devices.

2. The method of claim 1 additionally comprising, prior to forming said first polysilicon layer, growing a first silicon dioxide layer over said EPROM substrate region.

3. The method of claim 1 additionally comprising heating to oxidize said self-aligned EPROM gates and to further oxidize said P-channel and N-channel gates.

4. The method of claim 2 additionally comprising, prior to forming said second polysilicon layer, growing a second silicon dioxide layer directly over said P-channel and N-channel regions.

5. The method of claim 4 additionally comprising, after forming said first polysilicon layer, growing a third silicon dioxide layer over said first polysilicon layer, prior to depositing said second polysilicon layer.

6. The method of claim 5 wherein step (f) includes the steps of successively etching said second polysilicon layer, said third oxide layer and said first polysilicon layer, in that order.

7. The method of claim 6 wherein said steps of successively etching comprise:
   (a) performing a polysilicon etch through a mask to remove a portion of said second polysilicon layer and to shape said EPROM control gate;
   (b) performing a polysilicon oxide etch through said mask to remove said third oxide layer in the area peripheral to said control gate; and (c) performing another polysilicon etch through said mask to remove a portion of said first polysilicon layer in an area peripheral to said control gate to shape said EPROM floating gate and to provide mutual alignment between said control and floating gates.

8. The method of claim 3 wherein said introducing impurities to form said sources and drains is partly accomplished by forming an ion-implant masking layer covering said EPROM and said N-channel regions, and exposing said P-channel region; and implanting P-type ions to form the source and drain of said P-channel device wherein said P-channel gate serves also as an implant mask and determines the channel length of said P-channel device.

9. The method of claim 8 wherein said introducing impurities is additionally accomplished by forming an ion-implant masking layer covering said P-channel region and exposing said EPROM and N-channel regions; and implanting N-type arsenic ions to form the sources and drains of said EPROM device and of said N-channel device, respectively, wherein said self-aligned gates serve also as an implant mask and at least partially determines the channel length of said EPROM device, and wherein said N-channel gate also serves as an implant mask and determines the channel length of said N-channel device.

10. The method of claim 9 wherein said introducing impurities is additionally accomplished by implant masking layer to determine, by shortening, the channels between the respective sources and drains of said EPROM device and of said N-channel device.

* * * * *